US006282251B1

(12) United States Patent
Worstell

(10) Patent No.: US 6,282,251 B1
(45) Date of Patent: Aug. 28, 2001

(54) MODIFIED VITERBI DETECTOR WHICH ACCOUNTS FOR CORRELATED NOISE

(75) Inventor: Glen Douglas Worstell, Santa Cruz, CA (US)

(73) Assignee: Seagate Technology LLC, Shakopee, MN (US)

( * ) Notice: Subject to any disclaimer, the term of this patent is extended or adjusted under 35 U.S.C. 154(b) by 0 days.

(21) Appl. No.: 08/407,230

(22) Filed: Mar. 21, 1995

(51) Int. Cl.[7] .................................................. H03D 1/100
(52) U.S. Cl. .......................................... 375/341; 714/794
(58) Field of Search ............................... 375/341; 371/43; 360/29; 714/794

(56) References Cited

U.S. PATENT DOCUMENTS

| 4,571,734 | * | 2/1986 | Dolivo et al. | 375/341 |
| 5,081,651 | * | 1/1992 | Kubo | 375/341 |
| 5,291,499 | | 3/1994 | Behrens et al. | 371/43 |
| 5,341,387 | * | 8/1994 | Nguyen | 375/341 |
| 5,440,588 | * | 8/1995 | Murakami | 371/43 |
| 5,454,014 | * | 9/1995 | Blaker et al. | 375/341 |
| 5,486,956 | | 1/1996 | Urata | 360/65 |
| 5,521,767 | | 5/1996 | Weng et al. | 360/46 |

OTHER PUBLICATIONS

Proakis, J.G., Digital Communications. New York: McGraw–Hill Book Company, 1989, pp. 554–561.*

Edward A. Lee and David G. Messerschmitt, *Digital Communication*, published by Kluwer Academic Publishers, pp. 275–286, 1988.

Lineu C. Barbosa, "Maximum Likelihood Sequence Estimators: A Geometric View," *IEEE Transactions on Information Theory*, vol. 35, No. 2, pp. 419–427, Mar. 1989.

M. Kobayashi et al., "Beyond I um$^2$/bit High Density Recording with Improved QAM Technique," *IEEE Transactions on Consumer Electronics*, vol. 37, No. 3, pp. 283–290, Aug. 1991.

Kelly J. Knudson, Jack K. Wolf and Laurence V. Milstein, "Dynamic Threshold Implementation of the Maximum–Likelihood Detector for the EPR4 Channel", *Proceedings of Globecom 91, IEEE Communications Society*, pp. 2135–2139, Dec. 1991.

Robert W. Hawley, Thu–ji Lin and Henry Samueli, "A 300 MHz Digital Double–Sideband to Single–Sideband Converter in 1 μm CMOS", *IEEE Journal of Solid–State Circuits*, vol. 30, No. 1, pp. 4–10, Jan. 1995.

* cited by examiner

Primary Examiner—Stephen Chin
(74) Attorney, Agent, or Firm—Joseph R. Kelly; Westman, Champlin & Kelly, P.A.

(57) ABSTRACT

A system detects an input signal received over a plurality of time periods. The input signal corresponds to one of a plurality of states during each time period, the states being connected by branches. The input signal has a value that is changeable from one of the plurality of time periods to the next. A first merged state is detected in which the branches during a first merge time period lead to only one of the plurality of states. A metric is determined for each of the plurality of states for each time period. The metric is based on the value of the input signal during a present time period, the value of the input signal during a previous time period, and on the plurality of branches connected to the states for which the metric is being determined. The likely branch leading to each of the plurality of states is identified based on the metric determined for that state. A second merged state is detected in which the branches during a second merge time period lead to only one of the plurality of states. The value of the input signal is determined for each time period between the first and second merged states based on the likely branches leading between the first and second merged states.

19 Claims, 6 Drawing Sheets

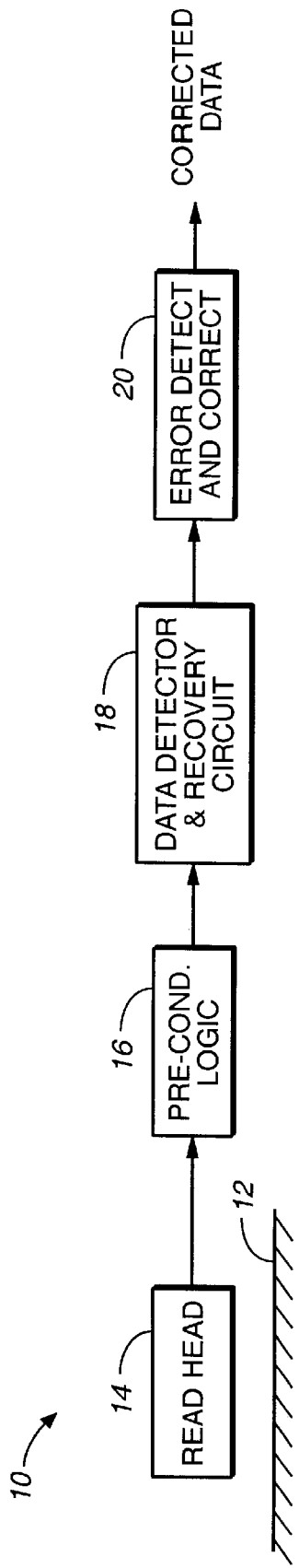
FIG._1
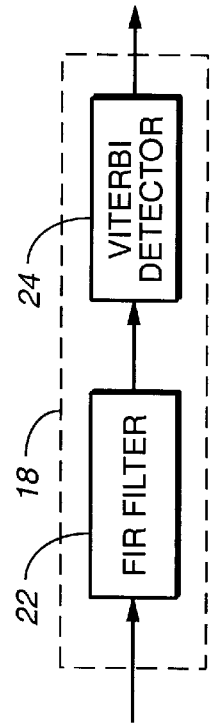
FIG._1A

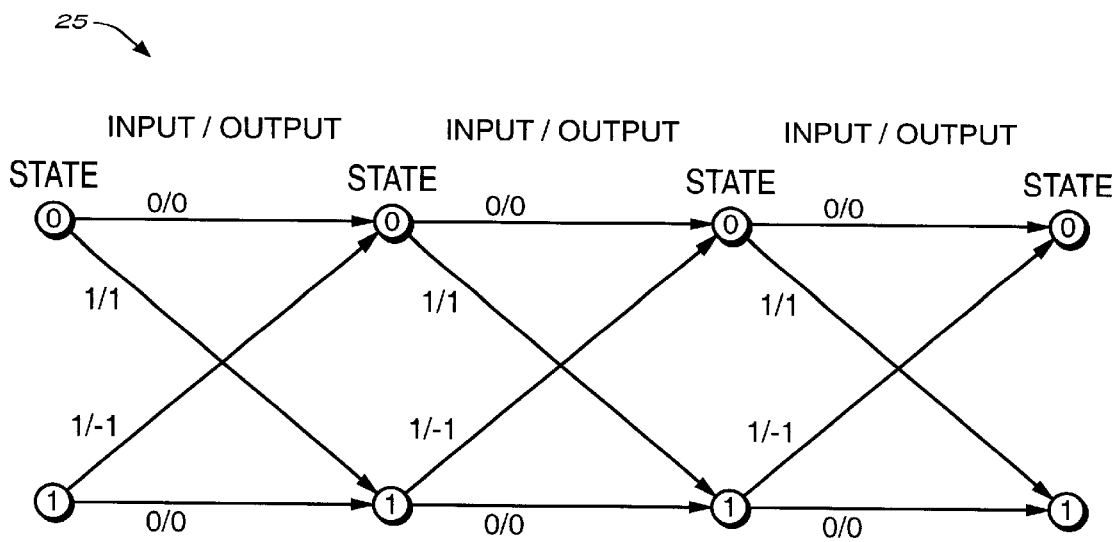
FIG._2
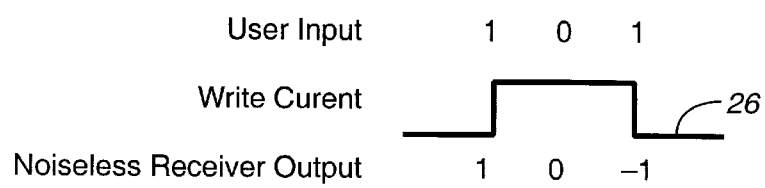
FIG._3
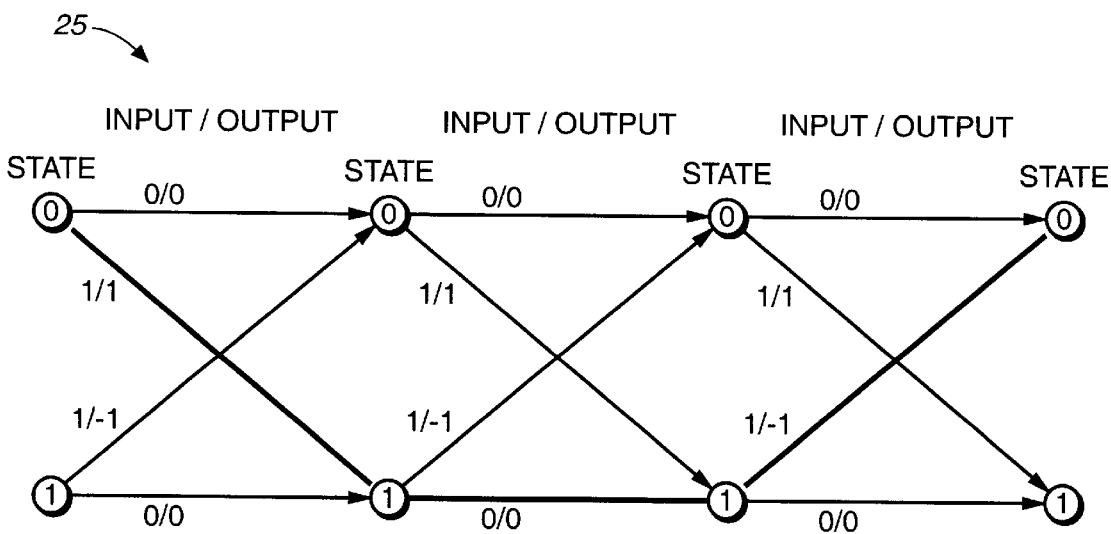
FIG._3A

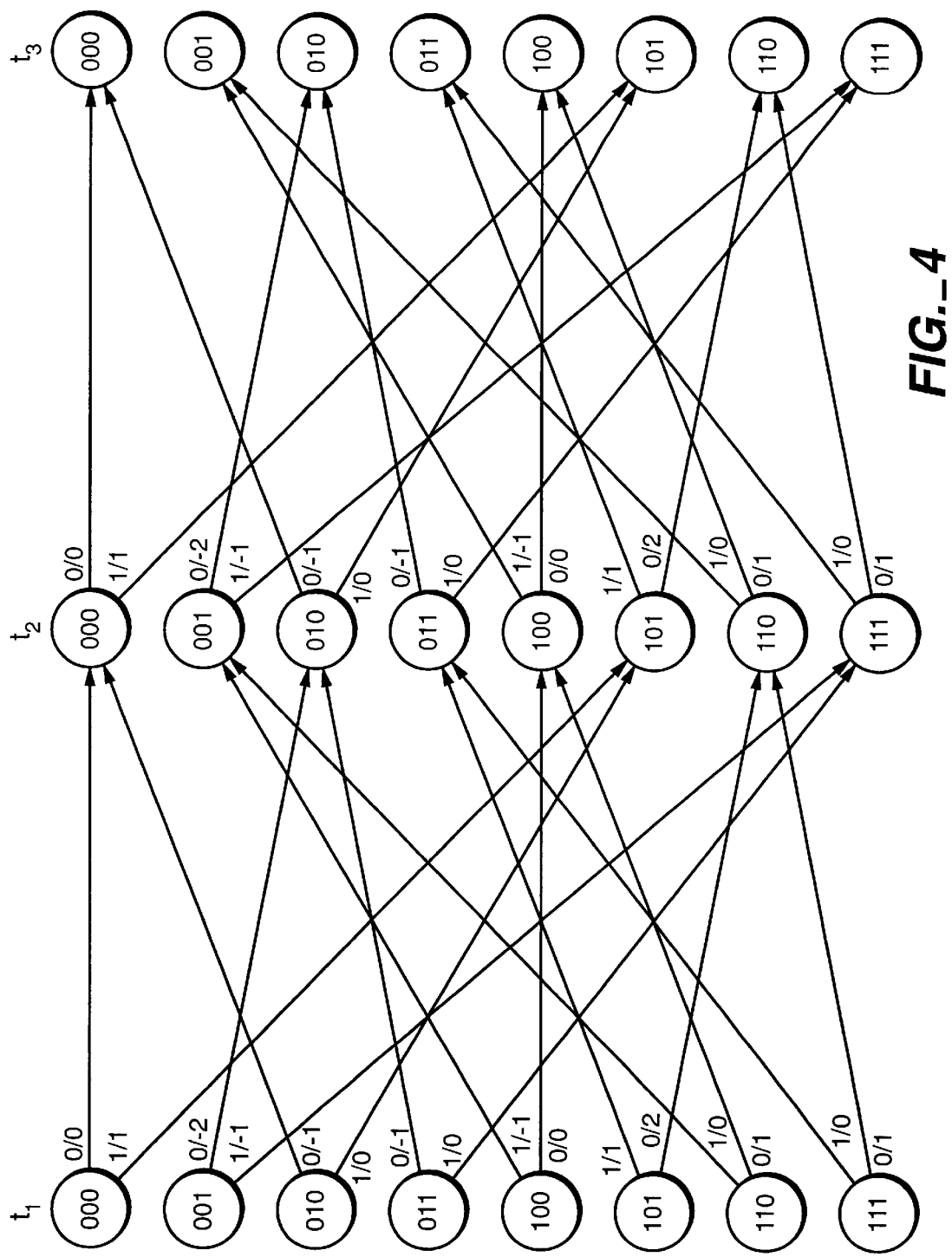
FIG._4

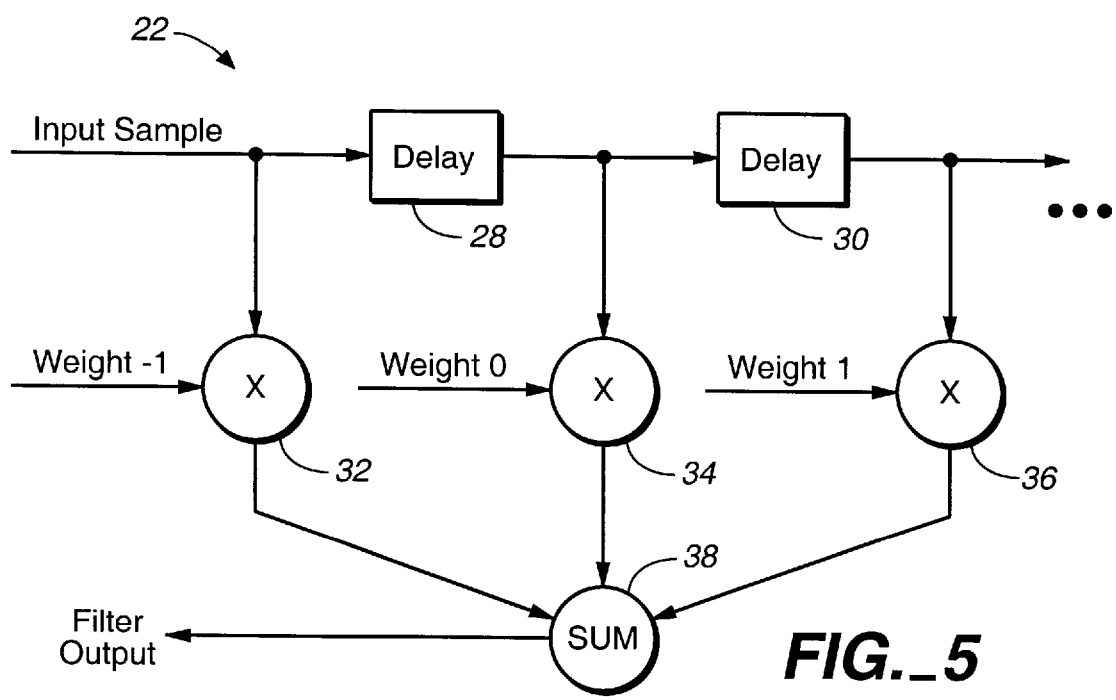
FIG._5

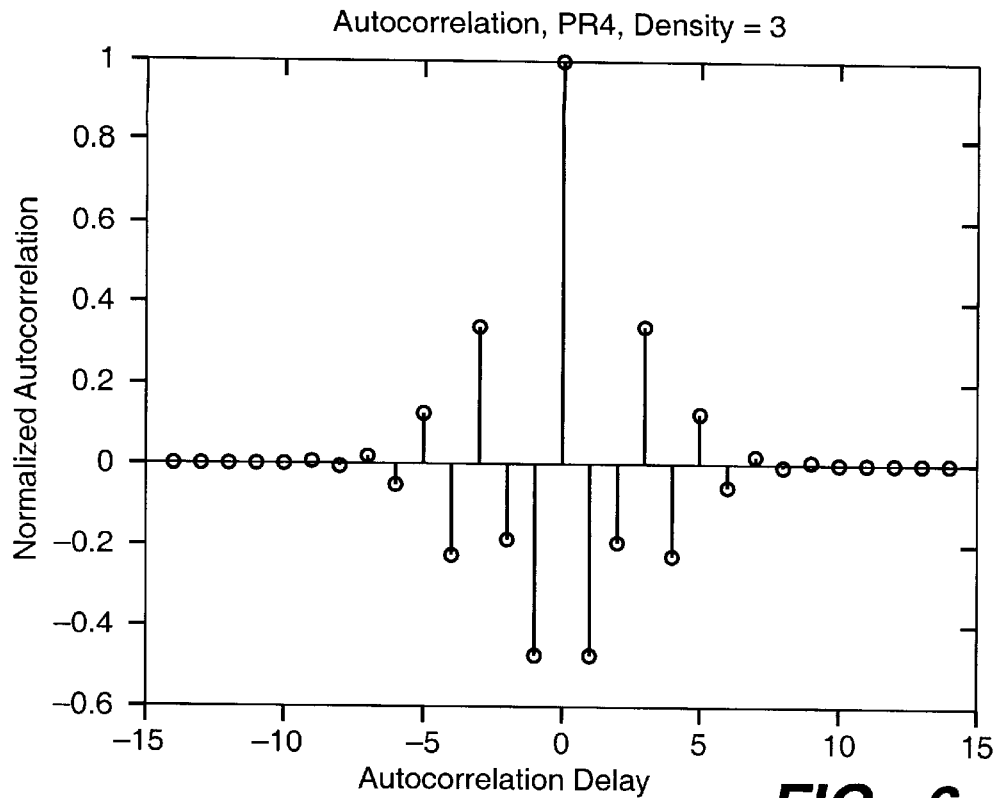
FIG._6
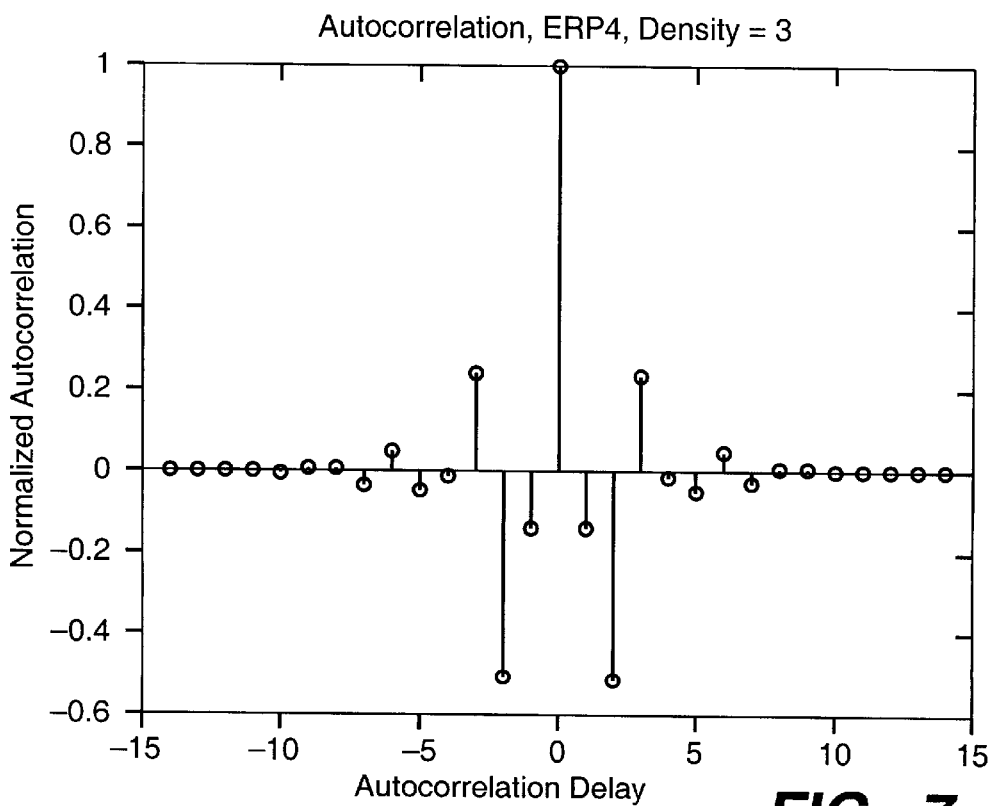
FIG._7

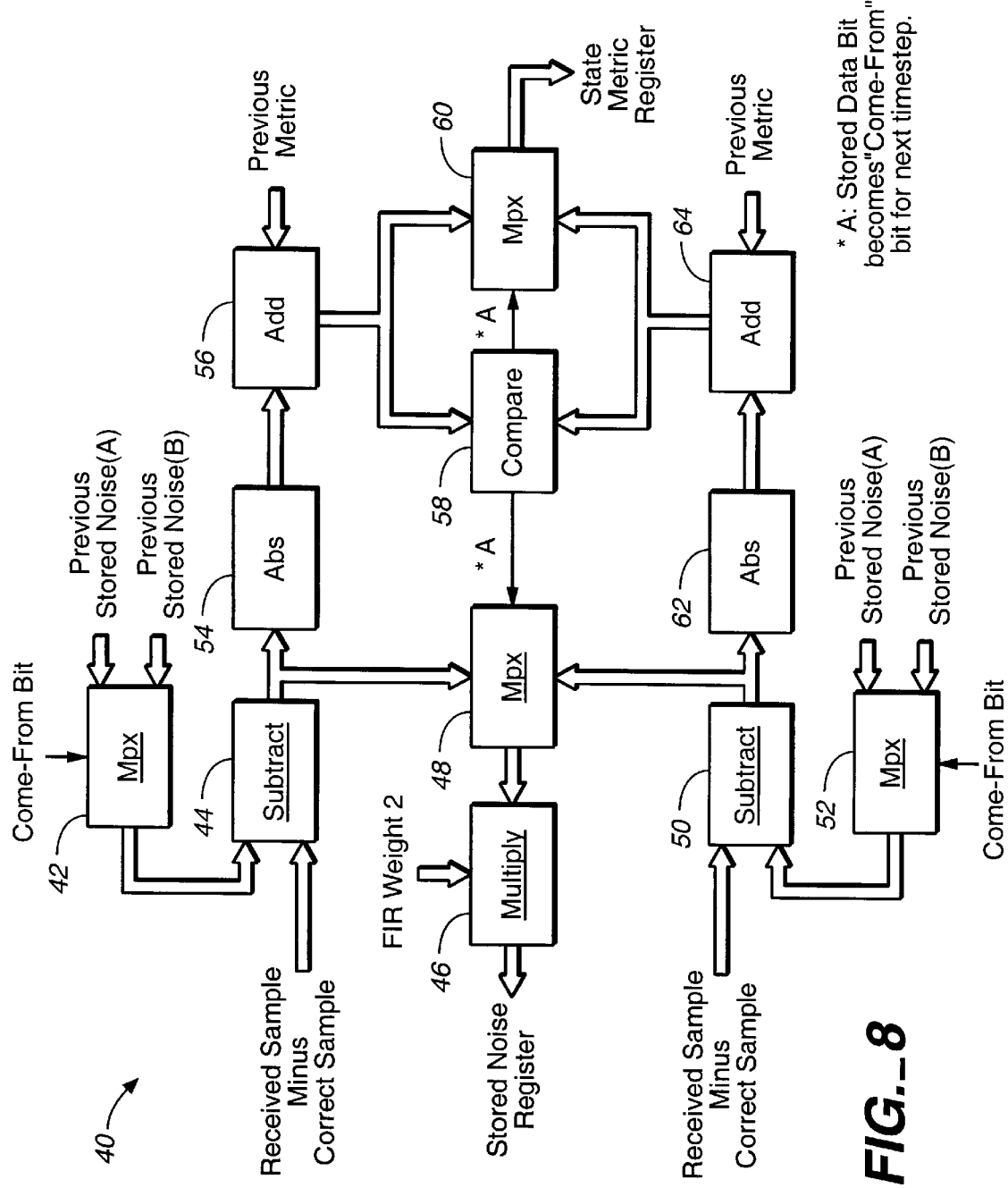
FIG._8

MODIFIED VITERBI DETECTOR WHICH ACCOUNTS FOR CORRELATED NOISE

BACKGROUND OF THE INVENTION

The present invention relates to disc drives. More particularly, the present invention relates to a data detector in a disc drive wherein the data detector accounts for correlated noise.

A typical disc drive includes one or more magnetic discs mounted for rotation on a hub or spindle. A typical disc drive also includes a transducer supported by a hydrodynamic air bearing which flies above each magnetic disc. The transducer and the hydrodynamic air bearing are collectively referred to as a data head. A drive controller is conventionally used for controlling the disc drive based on commands received from a host system. The drive controller controls the disc drive to retrieve information from the magnetic discs and to store information on the magnetic discs.

An electromechanical actuator operates within a negative feedback, closed-loop servo system. The actuator moves the data head radially over the disc surface for track seek operations and holds the transducer directly over a track on the disc surface for track following operations.

Information is typically stored in concentric tracks on the surface of magnetic discs by providing a write signal to the data head to encode flux reversals on the surface of the magnetic disc representing the data to be stored. In retrieving data from the disc, the drive controller controls the electromechanical actuator so that the data head flies above the magnetic disc, sensing the flux reversals on the magnetic disc, and generating a read signal based on those flux reversals. The read signal is typically conditioned and then decoded by the drive controller to recover data represented by flux reversals stored on the magnetic disc, and consequently represented in the read signal provided by the data head.

A typical read channel includes the data head, preconditioning logic (such as preamplification circuitry and filtering circuitry) a data detector and recovery circuit, and error detection and correction circuitry. The read channel can be implemented either as discrete circuitry, or in a drive controller associated with the disc drive.

A Viterbi detector has been investigated in the past for use as a data detector in a disc drive read channel. A Viterbi detector acts as a maximum-likelihood sequence estimator when the input to the detector consists of a signal plus additive white, Gaussian noise, and when a typical branch metric (the square of the error in the signal provided to the detector) is used. However, in an actual disc drive channel, the noise from the media is generally colored. In addition, in order to practically implement a Viterbi detector in a disc drive, a filter or equalizer must be used in order to obtain a simplified partial-response polynomial target. Thus, the noise at the input to the detector is further colored by the filter or equalizer which is required to simplify the target response. The filter or equalizer correlates or combines noise in the system by combining noise components from several different instants in time.

Conventional Viterbi detectors are utilized with branch metrics that do not take into account the correlation of noise in the filter or equalizer. Thus, if the noise is colored, as is almost always the case, the Viterbi detector is suboptimum. For example, if the target response is a simplified EPR4 target, the Viterbi detector gives up in excess of 2 dB in the signal-to-noise ratio over a maximum likelihood sequence estimator. Thus, to date, the Viterbi detector has been suboptimimum for use in magnetic disc drives.

SUMMARY OF THE INVENTION

The present invention uses a branch metric in a Viterbi detector which is based on a current signal sample, as well as one or more previous signal samples. In this way, the Viterbi detector according to the present invention accounts for correlated noise in the system.

In a preferred embodiment, a system detects an input signal received over a plurality of time periods. The input signal corresponds to one of a plurality of states during each time period, the states being connected by branches. The input signal has a value that is changeable from one of the plurality of time periods to the next. A first merged state is detected in which the branches during a first merge time period lead to only one of the plurality of states. A metric is determined for each of the plurality of states for each time period. The metric is based on the value of the input signal during a present time period, the value of the input signal during a previous time period, and on the plurality of branches connected to the states for which the metric is being determined. The likely branch leading to each of the plurality of states is identified based on the metric determined for that state. A second merged state is detected in which the branches during a second merge time period lead to only one of the plurality of states. The value of the input signal is determined for each time period between the first and second merged states based on the likely branches leading between the first and second merged states.

BRIEF DESCRIPTION OF THE DRAWINGS

FIG. 1 is a simplified block diagram of a read channel used in a magnetic disc drive.

FIG. 1A is a more detailed block diagram of a data detection on recovery circuit according to the present invention.

FIG. 2 is a trellis diagram illustrating operation of a Viterbi detector.

FIG. 3 is a waveform showing write current used in writing an input sequence, and also showing the output sequence corresponding to the input sequence.

FIG. 3A is a trellis diagram illustrating a detector output based on the input shown in FIG. 3.

FIG. 4 is a trellis diagram for an EPR4 code with a target response equal to [121].

FIG. 5 is block diagram illustrating a finite impulse response (FIR) filter or equalizer used with one embodiment of the Viterbi detector according to the present invention.

FIG. 6 is a plot of an autocorrelation function of a 15 tap FIR filter for a PR4 code.

FIG. 7 is a plot of an autocorrelation function of a 15 tap FIR filter for an EPR4 code.

FIG. 8 is a block diagram of one preferred embodiment of a circuit used in implementing a simplified metric in a Viterbi detector according to the present invention.

DETAILED DESCRIPTION OF THE PREFERRED EMBODIMENTS

FIG. 1 is a simplified block diagram of a read channel 10 according to the present invention. Read channel 10 includes magnetic disc 12, read head 14, preconditioning logic 16, data detector and recovery circuit 18 and error detector and correction circuit 20. An actuator assembly (not shown) typically holds read head 14 in position over a surface of disc 12. The actuator assembly includes actuator arms which are rigidly coupled to a head gimbal assembly. The head gimbal assembly, in turn, includes a load beam, or flexure arm, rigidly coupled to the actuator arm at a first end thereof, and to a gimbal at a second end thereof. The gimbal is coupled to a hydrodynamic air bearing which supports read head 14 above the corresponding surface of disc 12 for accessing data within tracks on the surface of disc 12.

In operation, a drive controller associated with the disc drive containing read channel 10 typically receives a command signal from a host system which indicates that a certain portion of disc 12 is to be accessed. In response to the command signal, the drive controller provides a servo control processor with a position signal which indicates a particular cylinder over which the actuator is to position read head 14. The servo control processor converts the position signal into an analog signal which is amplified and provided to the actuator assembly. In response to the analog position signal, the actuator assembly positions read head 14 over a desired track.

Read head 14 develops a read signal indicative of flux reversals in the track over which read head 14 is positioned. The read signal is provided to preconditioning logic 16 which typically includes a preamplifier and filtering circuitry. The amplified and filtered signal is provided to data detector and recovery circuity 18 which recovers data encoded on the surface of disc 12. Data detector and recovery circuit 18 is described in greater detail later in the application. Once the data is detected and recovered, it is provided to error detection and correction circuitry 20 which, in this preferred embodiment, is based on an error correction code (ECC), such as a Reed-Solomon code. Error detection and correction circuit 20 detects whether any errors have occurred in the data read back from the disc.

In one preferred embodiment, error detection and correction circuit 20 is provided with error correction logic which is used to correct errors discovered in the data read back from disc 12. The corrected data is provided to the host system. In another preferred embodiment, error detection and correction circuit 20 simply provides an indication to the drive controller that the data being provided includes errors, and provides the drive controller with the information necessary so that the drive controller can correct the data and provide corrected data to the host system.

FIG. 1A shows a more detailed block diagram of data detector and recovery circuit 18. While data detector and recovery circuit 18 will typically include conventional pulse detection and qualification circuitry, it also includes, in the preferred embodiment, finite impulse response (FIR) filter 22 and Viterbi detector 24.

Normal operation of the Viterbi detector 24 is more easily understood using a trellis diagram, which is a typical state machine diagram drawn with an additional parameter, discrete time. FIR filter 22 is provided to simplify or translate the input signal pulses into a target response (pulses which have fewer non-zero values). For example, FIG. 2 shows a trellis diagram 25 illustrating the operation of FIR filter 22 and Viterbi detector 24. It is assumed in FIG. 2 that the present system has an isolated step response which is equalized by FIR filter 22 such that it is "slimmed" providing a sampled transition or "step" response which has only one non-zero value. In such a system, there is no intersymbol interference between adjacent pulses at the output of the system. Assuming a user input bit of zero represents no transition or flux reversal read from the disc, and a bit of one represents a transition (i.e., assuming an NRZI coding system), and assuming that the peak sampled value of the equalized transition is one, then an input of zero provides an output of zero, and an input of one provides an output of either one or minus one. This depends on the polarity of the last transition. Given the above system, it is clear that the polarities of transitions must alternate.

All of these rules are captured in a state machine diagram, such as that shown in FIG. 2, with a state of zero indicating that the last transition was negative and a state of one indicating that the last transition was positive. The state diagram can be modified, as shown in FIG. 2, by repeating the states for each discrete time step, with increasing time to the right. Such a trellis diagram can be used to determine the noiseless output sequence for any user input sequence.

FIG. 3 shows one example. The user input sequence is [101]. A corresponding write current for writing the user input is indicated by wave shape 26. Assuming the initial magnetization is state zero, then the noiseless receiver output sequence is [10-1]. This result can also be found by converting the input sequence to NRZI by simply changing every other 1 to a minus 1, and then convolving with the step response at the output of the equalizer (at the output of FIR filter 22).

Viterbi detector 24 operates by selecting the most likely path through the trellis diagram 25 given some received sequence. A "metric" is kept for each state at each time, and a "previous state" is also kept for each state at each time. As new samples are received, new metrics are computed.

In the past, branch metrics were computed for each branch by finding the noise and misequalization error for that branch. This is the difference between the sample value and the correct noiseless output value (from trellis 25) for that branch, and squaring the result as follows:

$$B_{b,nt} = X_{b,nt}^2 \qquad \text{Equation 1}$$

where $B_{b,nt}$ is the metric for branch b at time nt, and
$X_{b,nt}$ is the difference between the correct, noiseless sample for branch b and the actual sample value at time nt.

The actual sample value at time nt is given by:

$$X_{b,nt}^2 = (y_{b,nt} - y_{nt})^2 \qquad \text{Equation 2}$$

where $y_{b,nt}$ is the correct sample value for branch b, and $y_{nt}$ is the actual received value.

Once the branch metric was determined for each branch, then all possible new state metrics were determined for each state by considering each branch which leads to the state. The previous state metric for that branch is obtained and added to the branch metric. The sum of these two metrics is a potential state metric for the current state. Whichever resulting potential state metric is the lowest defines the most likely transition to the current state. The lowest potential state metric is stored as the state metric.

Once the metrics are determined, the user input bits are found by starting with the right-most part of trellis 25 and backtracking to the left, following the stored previous states. It has been observed that, occasionally, all branches for some discrete time period merge, or come from the same state. This time period is detected by Viterbi detector 24 and is referred to as a merge time period. The state through which the branches all travel is referred to as the merged state. Since all branches or paths at the specified time period travel through the merged state, then it is certain that, during that time period, the merged state must have been the accurate state.

Once a merge time period is detected, Viterbi detector 24 is certain, during the merge time period, the output corresponded to the merged state. Therefore, the trellis diagram 25 is traced backward in time, following all likely paths calculated during previous time periods, starting from the present merged state, back to the previous merged state. By tracing the trellis diagram 25 backwards in this fashion, all of the input bits received from the last merge time period to the present merge time period are determined.

FIG. 3A illustrates one trace through trellis diagram 25 corresponding to the user input [101] shown in FIG. 3.

It has been found that the delay induced by the backtrack operation is preferably from approximately six to twenty or more time steps, and is typically used as a design parameter for Viterbi detector 24. If the delay is too short, the probability of making an error increases.

Therefore, it can be seen that the Viterbi detector 24, using the conventional branch metric illustrated above, is a practical implementation of a correlation receiver. The Viterbi detector determines the most likely path leading to each node in the trellis diagram 25, and all other paths can be discarded. This drastically reduces the number of paths required to be considered in the trellis diagram 25 and makes implementation practical.

Further, there is no need to store the entire length of the trellis. Rather, with normal coding techniques used in current disc drives, the most likely paths through trellis 25 will, with high probability, merge to a single state every few time periods. After each merge time period, the preceding detected bits can be determined and the process is restarted from the present merge state.

FIG. 4 shows a trellis diagram for an EPR4 code having a target response equal to [121]. Because an EPR code has three bits, the code is capable of assuming one of eight states during each time period. According to an EPR4 code, the first of the three bits in each state represents current magnetization, and the subsequent two bits in each state represent the previous two input bits detected, as is generally known. FIG. 4 shows three time periods t1, t2, and t3, each having the eight possible states indicated and circled. Two branches leave and enter states during each time period. Associated with each branch is a designation X/Y where X is the input sample, which is either a 0 or a 1, and Y is the detector output which is either −2, −1, 0, 1, or 2. As with the trellis diagrams in FIGS. 2 and 3A, if the input bit is a 0, no transition has taken place, and if the input bit is a 1, a transition has taken place.

FIG. 4 shows that, while there are only two input branches to each state, and while only two branches leave each state, if a data detector had to consider all of these branches for any significant data stream, the task would be so complex and cumbersome as to be impractical. However, the Viterbi detector considers each branch, as it is generated, and eliminates all but the most likely branches from state to state. Further, every so often, the branches from the states in a previous time period all merge to a single state during a subsequent time period. At that point, the merged state is most likely to be the correct state for the corresponding time period. The likely path leading to the merged state can then be traced backwards to the previous merged state to identify all input bits which occurred between the two merged states. Once this is determined, all of the data detector information stored prior to the current merged state can be dumped and information accumulation restarts and continues until the next merged state.

However, a conventional Viterbi detector using a conventional branch metric as illustrated above suffers from several disadvantages. When the noise at the input of such a Viterbi detector is white, the probability of that the detector will give a particular sequence when a different sequence was transmitted is given by the following equation:

$$P_e = Q\left[\frac{d}{2\sigma}\right] \quad \text{Equation 3}$$

where d is the Euclidean distance between the two sequences, σ is the standard deviation of the noise samples at the input to the detector, and Q(x) is the area under the normalized Gaussian density function from X to infinity, as follows:

$$Q(x) \equiv \frac{1}{\sqrt{2\pi}} \int_x^\infty \exp\left[\frac{-y^2}{2}\right] dy \quad \text{Equation 4}$$

However, another technique is known for determining the error probability when the noise is colored. If noise samples at the input to FIR filter 22 are Gaussian, white, and stationary, then the probability of mistaking one sequence for another is given as follows:

$$P_e = Q\left[\frac{0.5\langle He, He\rangle - \langle a_0, (H_0 - H)^T He\rangle}{\sqrt{\langle He, R_0 He\rangle}}\right] \quad \text{Equation 5}$$

where H is the assumed or desired transition response at the output of the equalizer;
e is the error sequence, or the difference between the correct and erroneous sequences;
$H_0$ is the actual transition response at the equalizer output;
$R_0$ is the autocorrelation of the noise at the equalizer output;
$a_0$ is the correct, transmitted sequence; and
<x, y> is the Euclidean or "dot" product of two vectors.

The second term in the above formula is due to misequalization in FIR filter 22 and can be neglected if FIR filter 22 has a sufficient number of taps.

The formula can be used with fractionally-spaced equalizers by representing H and $R_0$ as matrices. For channels modeled using Lorentzian transition response at channel densities of 3 or greater, the terms can be represented as vectors and polynomials, with convolution used for polynomial multiplication.

As an example, assume an uncoded Lorentzian channel with a channel density of 3.0. Since there is no coding, the user density is also 3. It is found that the minimum distance between two sequences at this density occurs when the sequences are $a_0$=[0, 1, −1, 0], and $a_1$=[1, −1, 1, −], and the error sequence is e=$a_0$−$a_1$=[−1, 2, −2, 1]. If the Lorentzian step response has a peak value of 1.0, then the distance between the outputs corresponding to these sequences is 0.6018. Note that there is no shaping of the target by an equalizer, so the target is the sampled Lorentzian step response.

If the signal is equalized to a step response of [121], commonly called EPR4, the distance between output sequences corresponding to $a_0$ and $a_1$, is 2.0. It is widely held that the squared distance should be considered in such a system, and for encoded EPR4, the minimum squared distance is 4.0. Because the equalizer has noise gain, the standard deviation of the noise at the output of the equalizer will be higher than that at the input. If the equalizer is implemented as FIR filter 22, for example, the noise gain is equal to the square root of the sum of the squares of the tap weights.

FIG. 5 illustrates one embodiment of an FIR filter 22 used with the present invention. FIR filter 22 includes delay lines 28 and 30, multipliers 32, 34 and 36 and summing node 38. At each sample time period, previous input samples are shifted to the right through tapped delay lines 28 and 30. Then, the current sample, and each delayed sample, are multiplied by corresponding tap weights in multipliers 32, 34 and 36. The results of the multiplications are added by summing node 38 to provide the filter output. For the present example, a long equalizer with tap weights selected to minimize equalization error has a noise voltage gain of approximately 3.168.

A maximum likelihood sequence estimator would have a probability of error for the above two sequences $$Q\left[\frac{d}{2\sigma}\right] = Q\left[\frac{0.6018}{2\sigma}\right] \quad \text{Equation 6}$$

If the correlation of noise at the output of FIR filter 22 is ignored, the probability of error for Viterbi detector 24 would be:

$$Q\left[\frac{2}{2\sigma 3.168}\right] \quad \text{Equation 7}$$

In Equation 7, the numerator is the distance between the error sequences, and the last term of the denominator represents the noise voltage gain of the equalizer. Rearranging Equation 7 provides:

$$Q\left[\frac{0.6313}{2\sigma}\right] \quad \text{Equation 8}$$

This would lead to the conclusion that Viterbi detector 24 performs better than a maximum likelihood sequence estimator, which is impossible.

Using the correct formula set out in Equation 5 above, and assuming that the equalizer has enough taps that the second term in the numerator can be ignored, then the probability is as follows:

$$Q\left[\frac{0.4663}{2\sigma}\right] \quad \text{Equation 9}$$

Thus, the actual performance of Viterbi detector 24 using a conventional metric is worse than the performance of a maximum likelihood sequence estimator by:

$$20 \cdot \log \frac{0.6018}{0.4663} = 2.2157 \text{ dB} \quad \text{Equation 10}$$

Therefore, by using the simplified EPR4 target response, one must give up approximately 2.2 dB of signal-to-noise ratio.

However, with the present invention, Viterbi detector 24 is modified to use a branch metric which considers prior input samples, as well as the present input sample, in order to account for correlated noise. In one preferred embodiment, it is assumed that all of the correlation of the noise is a result of filtering the sampled signal by FIR filter 22. The correlation of the noise is thus determinable based on the filter tap weights. In practice, some of the equalization may be done by a continuous-time filter in preconditioning logic 16, but this will still result in some particular autocorrelation of the noise. Thus, it can be treated as all coming from FIR filter 22.

For the embodiment of FIR filter 22 shown in FIG. 5, it is assumed that the largest weight is the center weight, numbered "Weight 0" in FIG. 5.

It can be seen from FIG. 5 that a noise sample in the input sample will affect the output sample for n sample times, wherein n is the number of tap weights in filter 22. Assuming the tap weights are known, then the noise autocorrelation function can be computed. For an FIR filter operating at a given channel bit rate, it is a straightforward calculation to determine the tap weights which give the minimum sum of squared errors. While that derivation will not be set out at length, the procedure preferably used in determining tap weights follows.

A matrix H is formed from the sampled isolated step response. The number of rows is equal to the desired number of equalizer tap weights, and the number of columns is equal to the number of non-zero samples in the step response. Assuming both values are odd, the center row of matrix H is the step response, and each row above the center is shifted one step to the left of the row below, and each row below the center is shifted one step the right of the row above.

Next, a row vector T is formed giving the desired target response to a step input. The length of the vector T is the number of columns of H. The center values will be the desired target response, which will in general be much shorter than the step response. The remaining values are filled in with zeros. Given the above, the column vector of weights can be computed as follows:

$$W = (HH^T)^{-1}HT \quad \text{Equation 11}$$

Knowing that noise in the present system is colored, and knowing that the noise samples are not independent, and now knowing the transfer function of FIR filter 22, the noise autocorrelation at the input Viterbi detector 24 can be described. The present invention utilizes this information to modify the branch metric used in Viterbi detector 24.

Assume the present system is a baud-rate sampled system with uncorrelated noise at the input to FIR filter 22, and assume FIR filter 22 is implemented as shown in FIG. 5 with an odd number of taps, and let the center weight zero (W0) be the largest, with the weights to the right (with greater delays) numbered W1 to WL. At each sample time t, the sample value is considered to be made up of the noiseless correct signal value at the input to FIR filter 22 plus a noise component referred to as $N_{Ai}$, which stands for "actual" noise in the ith sample. The sequence of samples formed by subtracting the signal from the received sequence is referred to as the noise sequence, which is assumed to be Gaussian and white. In other words, it is assumed that each noise sample is independent of the other noise samples at the input to FIR filter 22.

At the output of FIR filter 22, it can be seen that the equalized signal plus some "observed" noise, $N_{oi}$, can be calculated from the filter tap weights if the actual noise is known, as follows:

$$N_{oi} = N_{ai}W_0 + N_{ai-1}W_1 + N_{ai-2}W_2 + \ldots + N_{ai+1}W_{-1} + N_{ai+2}W_{-2} + \quad \text{Equation 12}$$

Assuming the weights are normalized so the largest weight, $W_0$, is 1, each branch metric is changed by a constant factor, so that there is no change in which branch has the lowest metric. The weights generally diminish in value as their distance from the center weight increases. Therefore, for the present derivation, it is assumed that weights $W_j$ are 0 where j is greater than 2.

If the contribution to the apparent noise from future samples is also ignored, then the formula given in Equation 12 simplifies to:

$$N_{oi} = N_{ai} + N_{ai-1}W_1 + N_{ai-2}W_2 \quad \text{Equation 13}$$

A branch metric of $N_{ai}^2$, which results from the actual or true uncorrelated noise, can be obtained by rearranging and squaring Equation 13 as follows:

$$N_{ai}^2 = N_{oi}^2 - N_{oi}N_{ai-1}W_1 - 2N_{oi}N_{ai-2}W_2 + N_{ai-1}^2 W_1^2 - 2N_{ai-1}N_{ai-2}W_1W_2 + N_{ai-2}^2 W_2^2 \quad \text{Equation 14}$$

In order to further simplify the new branch metric equation, it is assumed that $W_N$ is much smaller than 1 for N greater than 0. Therefore, terms with a $W_i W_j$ product can be omitted to obtain the following:

$$N_{ai}^2 = N_{oi}^2 - 2N_{oi}N_{ai-1}W_1 - 2N_{oi}N_{ai-2}W_2 \quad \text{Equation 15}$$

That part of the output of FIR filter 22 due to noise is visible in terms of $N_{oi}$. Therefore, rearranging Equation 13, and simplifying for observed noise, and changing i to i-1 gives:

$$N_{ai-1} = N_{oi-1} - N_{ai-2}W_1 - N_{ai-3}W_2 \quad \text{Equation 16}$$

Again, substituting and omitting terms with $W_i W_j$ products gives:

$$N_{ai}^2 = N_{oi}^2 - 2N_{oi}N_{oi-1}W_1 - 2N_{oi}N_{ai-2}W_2 \quad \text{Equation 17}$$

Repeating the above steps to eliminate the $N_{ai-2}$ term provides:

$$N_{ai}^2 = N_{oi}^2 - 2N_{oi}N_{oi-1}W_1 - 2N_{oi}N_{oi-2}W_2 \quad \text{Equation 18}$$

If it desired to make use of all the weights beyond the center weight, then Equation 18 can be modified as follows:

$$N_{ai}^2 = N_{oi}^2 - 2N_{oi}\sum_{j=1}^{L-1} N_{oi-j}W_j \quad \text{Equation 19}$$

where L is the number of taps in FIR filter 22 beyond the center tap.

Rewritten in the same terms as the conventional branch metric set out Equations 1 and 2 above, the new branch metric of Equation 19 can be described as follows:

$$B_{b,nt} = X_{b,nt}^2 - 2X_{b,nt}\sum_{i=1}^{L} X_{b,(n-i)t} W_i \quad \text{Equation 20}$$

where $B_{b,nt}$ is the branch metric for branch b at time nt;

$X_{b,nt}$ is the noise and equalization error at time nt for branch b;

$W_i$ is the ith tap weight of FIR filter 22;

L is the number of tap weights beyond the center weight.

The new branch metric can also be simplified for particular target responses. For example, the correlation of the noise at the output of FIR filter 22 can be described by the noise autocorrelation sequence. The autocorrelation sequence can be rather lengthy, leading to considerable complexity in the modified Viterbi detector 24. However, FIG. 6 is a plot of the autocorrelation delay against normalized autocorrelation for a PR4 code having a density equal to three. It is assumed that the noise at the input of FIR filter 22 is white, and FIR filter 22 is a 15 tap FIR filter with tap weights selected to minimize misequalization error. FIG. 6 shows that many of the elements of the autocorrelation sequence are very small in comparison to the 0th order element (which is always the largest). FIG. 6 shows that for PR4 (at a density of 3) the largest value is one step away from the 0th value, and the values at 2, 3 and 4 steps away, are also significant.

FIG. 7 is a plot of autocorrelation delay against normalized autocorrelation for an EPR4 code having a density of 3. For the EPR4, the largest value is two time steps away from the 0th value, and the other values are relatively small. Thus, FIG. 7 indicates that a Viterbi detector can be built which only takes into account the correlation of the noise caused by the second autocorrelation element. This leads to a large reduction in complexity with a small loss in performance compared to a Viterbi detector modified to account for substantially all autocorrelation elements.

Performance of modified Viterbi detector 22 was evaluated using a Matlab-callable program implementing the new branch metric. Using an encoded system with a density of 3, and an EPR4 target response with a 15-tap FIR filter, the following results were obtained:

number of sequences: 128400 number of bits in each sequence: 100 standard deviation of noise at input to FIR filter: 0.055 number of sequence errors for the modified Viterbi detector as a function of the number of weights used in the new metric set out in Equation 20 (including the center weight):

Weights: 1 2 3 4 8 101

Errors: 52 47 11 6 4 14

It should be noted that, using only one weight term corresponds to a conventional Viterbi detector which does not take into account the correlation of noise. It should also be noted that the term 101 refers to using only the third tap weight $W_2$ in addition to $W_0$.

Assuming that the probability of error is given by the Q function set out in Equation 5, the relative equivalent noise reduction for each of the above cases can be computed and compared to that for a conventional Viterbi detector. The equivalent noise reduction for the 8-correlation detector is 1.55 dB, and the reduction for the 101 detector is 0.86 dB. Thus, the 8-correlation detector gives back 1.55 dB of the 2.2 dB lost by using the simplified EPR4 polynomial target instead of the unequalized system step response. This significantly improves performance.

The modified metric used in accordance with the present invention can be further modified to take into account transition noise as well. If it is assumed that the standard deviation of the noise component of each sample is greater where there is a transition in the signal written to the disc than where there is no transition, then each branch metric can be modified by multiplying the metrics which correspond to transitions by a fraction which depends on the transition noise standard deviation. Implementing this in a fairly straightforward way would require 8 multipliers, one for each "one" branch leading to each state in the appropriate trellis diagram. As with the presently modified metric, one of the inputs to each of the multipliers is constant, so a simple, fast multiplier such as a canonical signed digital multiplier (as described in more detail in an article entitled *A 300 Mhz Digital Double-Sideband To Single-Sideband Converter in One µm CMOS*, written by Robert W. Hawley, Thu-ji Lin, and Henry Samueli and published in the IEEE Journal of Solid State Circuits, January 1995 —hereby fully incorporated by reference) can be used. Another implementation is to use sampled-analog techniques, in which multipliers are easier to implement.

The present modified metric can also be further simplified. A branch metric which has sometimes been used in Viterbi detector applications is the absolute value of the error, rather than the normal squared error. Using the present modified metric, which partly compensates for correlated noise, it is necessary to perform a multiplication of two variables for each branch at each time step. However, if the absolute value metric is used, the metric to compensate for noise correlation according to the present invention involves multiplying a variable by a constant at each time step. This multiplication can be implemented with simpler circuitry such as the canonical signed digit (CSD) method mentioned above.

Simulation results show that using the simpler absolute value metric results in performance almost as good as that from the error squared metric, and the CSD multiplier implementation has a complexity which is within practical limits.

In order to use the absolute value metric, Equation 13 is rearranged as follows Equation 13 is restated here for convenience:

$$N_{oi} = N_{ai} + N_{ai-1}W_1 + N_{ai-2}W_2 \quad \text{Equation 21}$$

The actual noise is approximated as follows:

$$N_{ai} = N_{oi} - N_{ai-1}W_1 - N_{ai-2}W_2 \quad \text{Equation 22}$$

The simplified branch metric is obtained by taking the absolute value of the expression set out in Equation 22. It can be seen that it becomes necessary to store the "actual" noise for each state for the previous two sample times. In order to calculate the actual noise, it is necessary to multiply the stored noise at previous sample times by a constant, which in the case of uncorrelated noise at the input to FIR filter 22 is simply the appropriate tap weight coefficient.

For EPR4 at normal densities, the second term can be neglected, and the resulting calculation becomes even further simplified, as follows:

$$N_{ai} = N_{oi} - N_{ai-2}W_2 \quad \text{Equation 23}$$

Given a particular sample value, the observed noise for each branch at each sample time is one of five possible values. The correct noiseless signal is one of the set [−2, −1, 0, 1, 2], so the observed noise is the sampled noise minus one of these values, depending on the branch in question. One preferred method of calculating the five values is by providing a look-up table in read only memory (ROM). If the received sequence is quantized to six bits, there are only 64 words in the look-up table. The ROM output is preferably each of the five possible observed noise values. If the output is quantized to eight bits, the ROM look-up table has 64 words of 40 bits each.

Note that the previous "actual" noise is always multiplied by the constant, and the resulting value is not needed until two time steps later. This allows the multiplication of the actual noise by the constant to be performed during a next sample time.

One preferred embodiment referred to as an add-compare-select (ACS) system for implementing the simplified metric according to the present invention is set out in block diagram form in FIG. 8. ACS system 40 includes logic for selecting the correct $N_{ai-2}$ term for the eight possible values stored two sample times previously.

ACS system 40 is provided for one state. Unless system 40 is shared with other states, the present invention would require eight ACS systems 40 for the implementation of an EPR4 detector, since such a code has eight states.

ACS system 40 includes multiplexer 42, subtract circuitry 44, multiplier 46, multiplexer 48, subtract circuitry 50, multiplexer 52, absolute value circuit 54, adder 56, compare circuit 58, multiplexer 60, absolute value circuit 62 and adder 64. It should be noted that, using the above simplified absolute value metric, a Viterbi detector which does not take into account the correlation of noise can be implemented using only circuits 54–64. However, in order to account for noise correlation two time steps away from a current sample, circuits 42–52 are added.

Each ACS system 40 is used with two branch metrics corresponding to the branches leading to a particular state. There is, by definition, a correct noiseless sample for each branch. The difference between the received sample and the correct noiseless value represents the apparent noise for that branch. To obtain the true noise, it is necessary to subtract the weight coefficients in FIR filter 22 times the true noise for the state leading to the branch in question.

Blocks 42, 44, 54 and 56 determine one of the two possible new state metrics for the particular state, and blocks 50, 52, 62 and 64 determine the other of the two possible new state metrics. There are two possible paths leading to each state, and these paths are constant. This can be seen in the trellis diagram shown in FIGS. 2, 3A and 4. There are two paths leading to each of the two possible previous states, and each of those has an associated stored corrected noise value. Multiplexers 42 and 52 select the correct stored noise value. This value is subtracted from the apparent noise by subtract circuits 44 and 50.

The absolute value of this "true" noise is taken in blocks 54 and 62 and added to the previous metric for the branch in adders 56 and 64. The two sums from adders 56 and 64 are compared by compare circuit 58. The smaller of these two values is selected by multiplexer 60 as the resulting state metric, which is stored in memory. In addition, the data bit determined from the paths with the lowest metric is stored and used during a next time step as the "come-from" bit.

The appropriate true noise from subtract circuits 44 and 50 is selected by multiplexer 48 and multiplied by a constant, in the preferred embodiment weight $W_2$ from FIR filter 22, and stored for use two time steps later. It is worth noting that the multiplication in multiply circuit 46 is by a small constant, and the result is not needed for two time steps. Thus, the multiplication can easily be performed in sufficient time.

It should also be noted that, in the preferred embodiment, six bits of precision for each digital quantity are believed to be sufficient for the sampled received signal.

In conclusion, the present invention provides a modified metric for use with a Viterbi detector that makes the Viterbi detector accurate, and simple enough to be implemented in a disc drive. The modified metric takes into account not only a presently sampled input signal, but a previously sampled signal as well. This allows the present Viterbi detector to account for correlated noise in the system and thereby improve performance.

Although the present invention has been described with reference to preferred embodiments, workers skilled in the art will recognize that changes may be made in form and detail without departing from the spirit and scope of the invention.

What is claimed is:

1. A method of detecting an input signal received over a plurality of time periods and corresponding to one of a plurality of states during each time period, the states being connected by branches, and the input signal having a value that is changeable from one of the plurality of time periods to a next of the plurality of time periods, the method comprising:

detecting a first merged state in which the branches during a first merge time period lead to only one of the plurality of states;

determining a metric for each of the plurality of states for each time period, the metric being based on an estimated value of noise in the input signal during a present time period and an estimated value of noise in the input signal during a previous time period and on the plurality of branches connected to the state for which the metric is being determined;

identifying a likely branch leading to each of the plurality of states based on the metric determined;

detecting a second merged state in which the branches during a second merge time period lead to only one of the plurality of states; and determining the value of the input signal for each time period between the first and second merged states based on the likely branches leading between the first and second merged states.

2. The method of claim 1 wherein determining a metric for each of the plurality of states comprises:

determining a branch metric for each branch connected to each of the plurality of states; and adding the branch metric to a previous state metric corresponding to a previous state during a previous time period to which the branch is connected to obtain a plurality of intermediate metrics for each of the plurality of states.

3. The method of claim 2 wherein identifying a likely branch comprises:

determining, for each of the plurality of states, which of the corresponding intermediate metrics has a smallest value; and storing the intermediate metric having the smallest value as the metric for the corresponding state, the metric being indicative of the likely branch.

4. The method of claim 1 wherein determining a metric further comprises:

determining a current observed noise value in the input signal for the present time period; and subtracting from the current observed noise value a prior noise value including at least one prior observed noise value corresponding to noise observed in the input signal during a prior time period, to obtain a metric noise value, wherein the prior observed noise value is weighted by a weighting factor.

5. The method of claim 4 wherein determining a metric further comprises:

determining an absolute value of the metric noise value.

6. The method of claim 4 wherein the prior noise value comprises a sum of a plurality of prior observed noise values weighted by weighting factors.

7. The method of claim 4 wherein the weighting factor comprises a unity weighting factor.

8. The method of claim 1 wherein the noise includes substantially uncorrelated noise and correlated noise.

9. The method of claim 8 wherein the correlated noise comprises:

error introduced by filtering.

10. The method of claim 1 wherein determining a metric further comprises:

squaring a current observed noise value for a first time period to obtain a present squared noise value; and subtracting from the present squared noise value a prior noise value including at least one prior observed noise value corresponding to noise in the input signal observed during a prior time period, wherein the prior observed noise value is weighted by a weighting factor.

11. The method of claim 10 wherein the prior noise value includes a sum of a plurality of prior observed noise values multiplied by weighting factors.

12. The method of claim 10 wherein the weighting factor comprises a unity weighting factor.

13. The method of claim 11 wherein a preselected number of prior observed noise values are multiplied by the current observed noise value.

14. A Viterbi detector detecting an input signal in a disc drive, the input signal having a value corresponding to one of a plurality of states during each of a plurality of time periods, the input signal reaching the one of the states from one of a plurality of previous states during a previous time period, the Viterbi detector comprising:

a metric calculator for determining a metric for each of the plurality of states associated with each time period, the metric calculator determining the metric based on an estimated value of noise in the input signal during a previous time period and an estimated value of noise in the input signal during a current time period;

a comparator, coupled to the metric calculator, comparing the metrics determined for each state; and a branch identifier, coupled to the comparator, identifying a previous state which likely preceded each of the plurality of states based on the comparison of the metrics.

15. The Viterbi detector of claim 14 wherein the previous states are connected to the plurality of states by branches and wherein the branch identifier identifies the previous state by identifying which of the metrics calculated for a given state is smallest.

16. The Viterbi detector of claim 15 wherein the metric calculator includes means for determining a current observed noise value in the input signal and subtracting from the current observed noise value a previous observed noise value corresponding to noise observed in the input signal during a previous time period, the previous observed noise value being weighted by a weighting factor.

17. A Viterbi detector detecting an input signal in a disc drive, the input signal having a value corresponding to one of a plurality of states during each of a plurality of time periods, the input signal reaching the one of the states from one of a plurality of previous states during a previous time period, the Viterbi detector comprising:

a metric calculator for determining a metric for each of the plurality of states associated with each time period, the metric calculator determining the metric based on an estimated value of noise in the input signal during a previous time period to account for correlated noise in the disc drive.

18. The Viterbi detector of claim 17 and further comprising:

a comparator, coupled to the metric calculator, comparing the metrics determined for each state; and a branch identifier, coupled to the comparator, identifying a plurality of branches, one of which likely led to each of the plurality of states, based on the comparison of the metrics.

19. The Viterbi detector of claim 18 wherein the metric calculator calculates a potential metric associated with each branch and wherein the branch identifier identifies the branch having a lowest associated potential metric, based on an output from the comparator.

* * * * *